(12) United States Patent
Ding

(10) Patent No.: US 7,498,569 B2
(45) Date of Patent: *Mar. 3, 2009

(54) ION TRAP MASS ANALYZER

(75) Inventor: Chuan-Fan Ding, Vancouver (CA)

(73) Assignee: Fudan University, Shanghai (CN)

( * ) Notice: Subject to any disclaimer, the term of this patent is extended or adjusted under 35 U.S.C. 154(b) by 263 days.

This patent is subject to a terminal disclaimer.

(21) Appl. No.: 11/628,477

(22) PCT Filed: Jun. 3, 2005

(86) PCT No.: PCT/CA2005/000866

§ 371 (c)(1),
(2), (4) Date: Dec. 1, 2006

(87) PCT Pub. No.: WO2005/119737

PCT Pub. Date: Dec. 15, 2005

(65) Prior Publication Data

US 2008/0067342 A1    Mar. 20, 2008

(30) Foreign Application Priority Data

Jun. 4, 2004    (CN)   .................. 2004 1 0024946

(51) Int. Cl.
*H01J 49/42*    (2006.01)
*H01J 49/26*    (2006.01)

(52) U.S. Cl. .................. 250/282; 250/281; 250/292; 250/290; 250/396 R

(58) Field of Classification Search ................. 250/282, 250/281, 292, 290, 396 R
See application file for complete search history.

(56) References Cited

U.S. PATENT DOCUMENTS

| 4,390,784 A | 6/1983 | Browning et al. |
| 5,834,771 A | 11/1998 | Yoon et al. |
| 6,040,573 A | 3/2000 | Sporleder et al. |
| 6,316,768 B1 | 11/2001 | Rockwood et al. |
| 6,897,438 B2 * | 5/2005 | Soudakov et al. ........... 250/288 |
| 7,045,797 B2 * | 5/2006 | Sudakov et al. ............. 250/292 |
| 7,141,789 B2 * | 11/2006 | Douglas et al. ............. 250/292 |
| 2003/0183759 A1 | 10/2003 | Schwartz et al. |

FOREIGN PATENT DOCUMENTS

| CN | 1585081 A | 2/2005 |
| WO | WO 01/29875 | 4/2001 |

* cited by examiner

*Primary Examiner*—Nikita Wells
(74) *Attorney, Agent, or Firm*—Berenato, White & Stavish, LLC

(57) ABSTRACT

An ion trap mass analyzer includes an elongated tunnel that has a wall, a longitudinal axis and an inner space. The wall includes a substrate and conductor trace patterns. There is also a variable electric potential means for providing electric potentials which is connected to the conductor trace patterns. The conductor trace patterns and the variable electric potential means provide a variable electric field within the inner space of the tunnel for transferring, storing, and analyzing ions.

36 Claims, 6 Drawing Sheets

US 7,498,569 B2

ION TRAP MASS ANALYZER

BACKGROUND OF THE INVENTION

1. Field of the Invention

This invention relates to an ion trap mass analyzer, and in particular to an ion trap mass analyzer constructed from printed circuit boards.

2. Description of Related Art

Quadrupole electric fields can be generated by various kinds of quadrupole ion optics. Driven by an RF voltage, these quadrupole ion optics are used for different purposes, e.g. an ion guide for ion transmission, a quadrupole mass filter for mass analysis or ion selection, and an ion trap for storage and analysis of ions. Among these devices, a quadrupole mass filter normally needs a high vacuum to achieve its performance while the ion guide and ion trap can work at a lower vacuum. An ion trap mass spectrometer is formed by combining an ion guide and an ion trap and coupling them to an ion source. A tandem mass spectrometer, otherwise known as an MS-MS, is formed by combining two mass spectrometers in tandem with a collision cell between them. The tandem mass spectrometer provides an opportunity to elucidate the structure of complex molecules and has increasingly found new applications in analytical chemistry.

A conventional ion trap mass spectrometer is a high precision mechanical device that includes machined hyperbolic surfaces. The manufacturing and assembly of such a device is very expensive, resulting in reduced productivity, due to the high precision required in the hyperbolic surfaces. Although a high pressure ion guide does not require the same level of precision, it cannot be used as an analytical device. Since the introduction of mass-selective-ejection operational modes in ion traps, it has been realized that an ion trap electrode structure with imperfections can be employed to achieve good analytical results. For example, a stretched ion trap results in good signal intensity and higher mass resolution. Furthermore, as a lower cost solution, simpler cylindrical geometries have been considered in the construction of the ion trap instead of more complicated rotational hyperbolic geometries. This lower cost ion trap can achieve a mass resolution over 1000 by proper design of the ratios of some important dimensions, e.g. the inner diameter of the cylinder and of injection/ejection apertures, and the distance between the end plates.

One of the disadvantages of a 3D ion trap mass spectrometer is its small charge capacity. When a large number of ions ($>10^6$) are stored in the trap, the space charge inside the trap will destroy its analytical performance. Recently, it has been realized that a linear ion trap can hold at least one order of magnitude more ions than the 3D ion trap before reaching the space charge limit. Linear ion trap configurations, such as disclosed in United States Patent Application Publication No. US2003/0183759A1, filed by Jae Schwartz et al. on Feb. 3, 2003, have become increasingly popular and have already been commercialized. The structure of a conventional linear ion trap, as shown in the FIG. 1, is similar to a three segmented quadrupole mass analyzer, where the front segment and back segment are held at a DC potential higher than the DC potential of the centre segment. Ions (positive ions in this case) which satisfy the stability condition of the quadrupole are confined by a DC field along the longitudinal axis of the trap and by an RF trapping field in a direction perpendicular to the longitudinal axis. Mass analysis can thereby take place under such a trapping condition.

It is, however, difficult to fabricate a linear ion trap. The machining of segmented rods and the alignment of all rods with precise parallelism and symmetry has contributed to a high cost of manufacture.

Chinese Patent No. CN85102274 discloses a quadrupole lens structure where a square shaped boundary was made with resistive material to generate a continuous varying electric potential along the boundary. Theoretically, this approach generates an ideal quadrupole field inside the lens structure. However, in practice it is difficult to obtain the high resistive coating with high thermal stability. When a radio frequency high voltage is applied to the resistive material, the power dissipation results in an increase in temperature, which in turn varies the impedance of the device. This off-tunes the resonance of the RF generator. Although a switching circuit for driving the quadrupole field can be used to avoid the above problem, as taught in PCT Application No. PCT/GB00/03964 by Ding et al., filed Oct. 16, 2000, the uneven temperature rise can still change the field distribution inside the ion optical structure so the analytical performance is still lost.

Efforts have been made to seek new materials in the fabrication of mass spectrometers. U.S. Pat. No. 6,316,768, issued Nov. 13, 2001 to Alan Rockwood et al., discloses a Time-of-Flight (ToF) mass spectrometer constructed with printed circuit board (PCB) materials. In the disclosure, it also mentions creating RF multipole ion guides utilizing PCBs whereby traces on the PCBs are disposed such that there exists an axial voltage gradient. However, the disclosed PCB structure can not be used as an ion trap because it does not provide a means to stop ions from escaping the structure along its axis and because the amount of octopole field induced by the shape of traces prevents the formation of a trapping field that is suitable to mass analysis.

It is an object of the present invention to provide techniques to produce low cost ion trap mass analyzers with good mass resolution. It is yet another object of the present invention to integrate optics for ion introduction and for mass analysis so that the construction and assembling of the mass spectrometer can be simplified while still being precise. It is a further object of the present invention to provide a high sensitivity, high throughput ion trap mass analyzer by combining ion traps in parallel while keeping the manufacturing cost low.

SUMMARY OF THE INVENTION

In a first aspect of the present invention, there is an ion trap mass analyzer that comprises an elongated tunnel. The elongated tunnel includes a wall and has a longitudinal axis and an inner space. The wall comprises a substrate and conductor trace patterns. There is also a variable electric potential means for providing electric potentials which is connected to the conductor trace patterns. The conductor trace patterns and the variable electric potential means provide a variable electric field within the inner space of the tunnel for transferring, storing, and analyzing ions.

In a second aspect of the present invention, the above described ion trap mass analyzer includes an ion transmission section and an ion trapping and analysis section, ions are injected into the ion trapping and analysis section from the ion transmission section.

In a third aspect of the present invention, there is an ion trap mass analyzer that comprises a plurality of ion trapping and analysis sections. Each of the ion trapping and analysis sections comprises an elongated tunnel. The elongated tunnel includes a wall and has a longitudinal axis and an inner space. The wall comprises a substrate and conductor trace patterns. Each of the ion trapping and analysis sections are adjacent to and extend alongside respective ones of the ion trapping and analysis sections. There is also a variable electric potential means for providing electric potentials which is connected to the conductor trace patterns of each of the ion trapping and analysis sections.

In a fourth aspect of the present invention, there is a method for tandem mass analysis using an ion trap mass analyzer which has a plurality of ion trap and analysis sections. Each of the ion trap and analysis sections comprises an elongated tunnel that has a wall, a longitudinal axis and an inner space. The wall comprises a substrate and conductor trace patterns. Each of the ion trap and analysis sections extends alongside respective adjacent ion trap and analysis sections. The method comprises the steps of applying a high frequency voltage to the conductor trace patterns to create a trapping quadrupole electric field in each of the ion trap and analysis sections, providing ions in a first one of the ion trap and analysis sections, cooling the ions in the first one of the ion trap and analysis sections using a buffer gas, applying an excitation voltage to the conductor trace patterns in the first one of the ion trap and analysis sections to eject selected precursor ions by means of resonance ejection to a second one of the ion trap and analysis sections, the second one of the ion trap and analysis sections being adjacent the first one of the ion trap and analysis sections, fragmenting the precursor ions in the second one of the ion trap and analysis sections, and gathering and ejecting the fragmented ions from the second one of the ion trap and analysis sections.

In a fifth aspect of the present invention, there is a method for manufacturing an ion trap mass analyzer which comprises the steps of preparing multi-layer printed circuit boards that have trace patterns, forming a polygonal tunnel using said printed circuit boards, and bonding the printed circuit boards with metal plates inside the polygonal tunnel. The trace patterns on a tunnel side of the printed circuit boards are designed to create the required electric field within the polygonal tunnel for transferring, storing and analyzing ions when appropriate voltages are applied to the traces.

BRIEF DESCRIPTION OF THE DRAWINGS

The present invention will be more readily understood from the following description of preferred embodiments thereof given, by way of example, with reference to the accompanying drawings, in which.

DETAILED DESCRIPTION OF THE PREFERRED EMBODIMENTS

Figure 1:
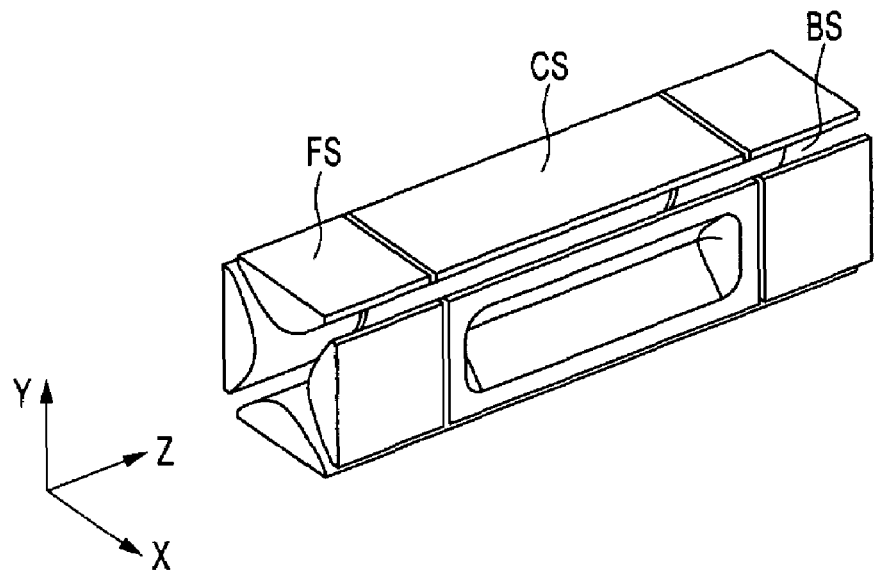
FIG. 1 is a perspective view of a conventional linear ion trap.
Figure 2:
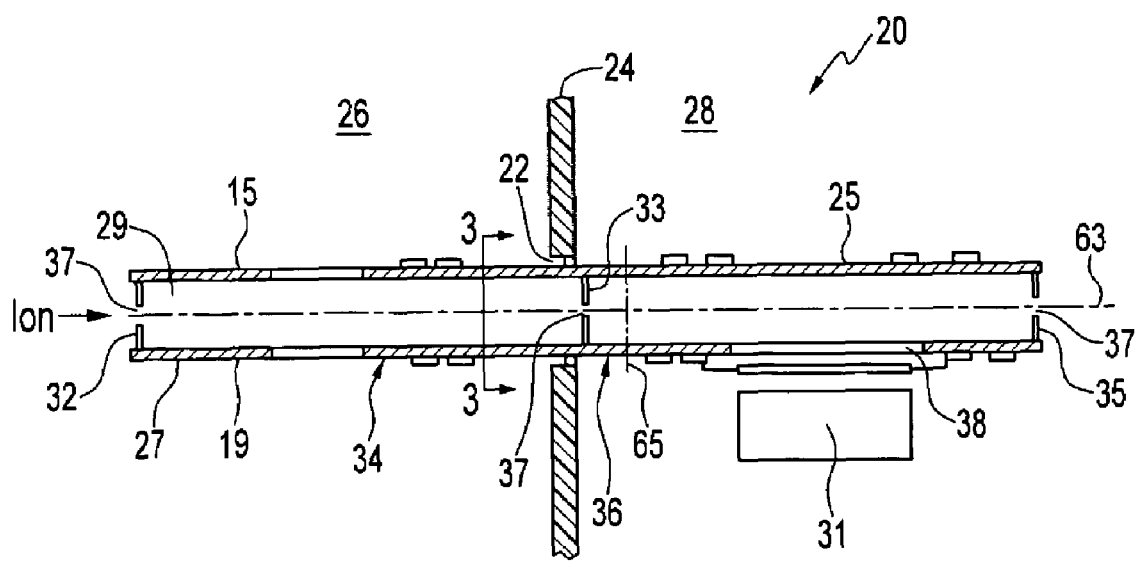
FIG. 2 is a sectional view of an ion trap mass analyzer according to an embodiment of the present invention.
Figure 3:
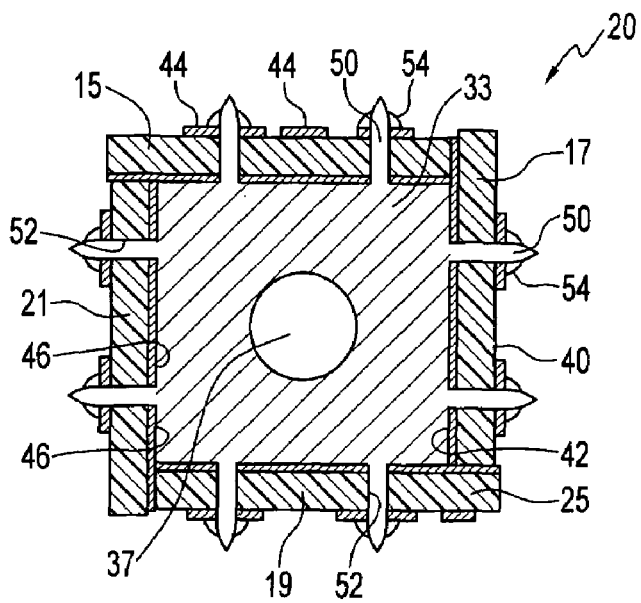
FIG. 3: is a cross-sectional view taken along line 3-3 of the ion trap mass analyzer of FIG. 2 omitting a wall between chambers.

Referring now to the drawings and first to FIGS. 2 and 3, an ion trap mass analyzer, indicated generally by reference numeral 20, extends through an orifice 22 in a wall 24. The wall 24 separates vacuum chambers 26 and 28, which are maintained at different environmental pressures. The ion trap mass analyzer 20 has an elongated, tube-like structure 27 and a detector 31.

The elongated structure 27 has a wall 25, and the wall 25 has an insulator substrate. In other embodiments the wall 25 can comprise other types of substrates, e.g. a semiconductor substrate. In this example, the wall 25 includes four elongated printed circuit boards (PCBs) 15, 17, 19 and 21, which are best shown in FIG. 3. The PCBs 15, 17, 19 and 21 are arranged side-by-side along their longitudinal axis, and each of the PCBs 15, 17, 19 and 21 is substantially perpendicular to respective adjacent PCBs 15, 17, 19 and 21. Therefore the elongated structure 27 is in the form a tunnel 29 having a longitudinal axis 63 and box-shaped inner space.

As shown in FIG. 2, first, second and third metal plates 32, 33 and 35 respectively separate the tunnel 29 into an ion guide section 34 and an ion trap and analysis section 36, and also function to bind the PCBs 15, 17, 19 and 21 together. The metal plates 32, 33 and 35 each has a central orifice 37. The ion guide section 34 receives ions from an ion source (not shown), which is normally placed at a higher environmental pressure, and guides them towards the ion trap and analysis section 36. The ion trap and analysis section 36 normally requires a lower environmental pressure, and sometimes a different gas content, than the ion guide section 34. The second metal plate 33 between the sections 34 and 36 then also functions to limit the penetrating flow of gas caused by the differential in environmental pressure or gas content between the sections 34 and 36.

Each of the chambers 26 and 28 has its own pumping means (not shown). The chamber 28 preferably maintains an environmental pressure around $10^{-5}$ mbar due to requirements of the detector 31, which normally includes an electron multiplier. The environmental pressures in the ion guide section 34 and the ion trap and analysis section 36 depend upon the pumping speed of the pumping means in the respective chambers 26 and 28, the diameters of the orifices 37 in the metal plates 32, 33 and 35 and upon openings, i.e. slits or holes 38, that are cut into the PCBs 15, 17, 19 and 21 which is explained in more detail below.

The ion trap mass analyzer 20 shown in FIG. 2 extends between only two chambers 26 & 28 of differing environmental pressure. In other embodiments the ion trap mass analyzer 20 can extend through more than two chambers wherein each chamber would have a unique environmental pressure maintained by corresponding pumping means. When the environmental pressure in the ion source is much higher (e.g. up to atmospheric pressure) than the environmental pressure in the ion trap and analysis section 36, there would be several chambers between the ion source and the ion trap and analysis section 36. In these other embodiments the chambers are separated by respective walls. The PCBs of the ion trap mass analyzer extend through all the chambers and walls, and corresponding metal plates divide the ion trap mass analyzer into sections and adapt the pressure between each of the sections at the respective walls.

Referring now to FIG. 3, each of the PCBs 15, 17, 19 and 21 has an outer surface 40 and an inner surface 42 as shown for PCB 17. The outer surface 40 has an outer metal layer from which outer electrically conducting trace patterns 44 are formed. The inner surface 42 has an inner metal layer from which inner electrically conducting trace patterns 46 are formed. Standard printing-and-etching processes of PCB manufacturing can be used to form the outer and inner trace patterns 44 and 46.

The inner trace patterns 46 are patterned to form the required electric field in the tunnel 29 when they are charged at certain voltages. The outer trace patterns 44 are used for propagation of electrical signals and for interconnecting electrical components mounted on the outer surface 40. These electrical components are responsible for voltage division and signal coupling of voltage sources and minimize the number of leads required between the ion trap mass analyzer and DC and AC voltage sources external to the vacuum chambers 26 and 28, and are described in more detail below. The inner trace patterns 46 are electrically connected to the outer trace patterns 44 by via holes, which can be either plated vias or filled vias.

In other embodiments of the present invention, the PCBs 15, 17, 19 and 21 may be multilayer PCBs having multiple layers of metalization and corresponding multiple layers of trace patterns.

Each of the metal plates 32, 33 and 35 has eight projections 50 shown in FIG. 3. Each of the projections 50 extends from the inner surface 42 to the outer surface 40 through corresponding holes 52 in the respective ones of the PCBs 15, 17, 19 and 21. The projections 50 are then soldered to selected ones of the outer trace patterns 44 at solder joints 54. The projections 50 are used to secure the metal plates 32, 33 and 35 to the PCBs 15, 17, 19 and 21.

Figure 4:
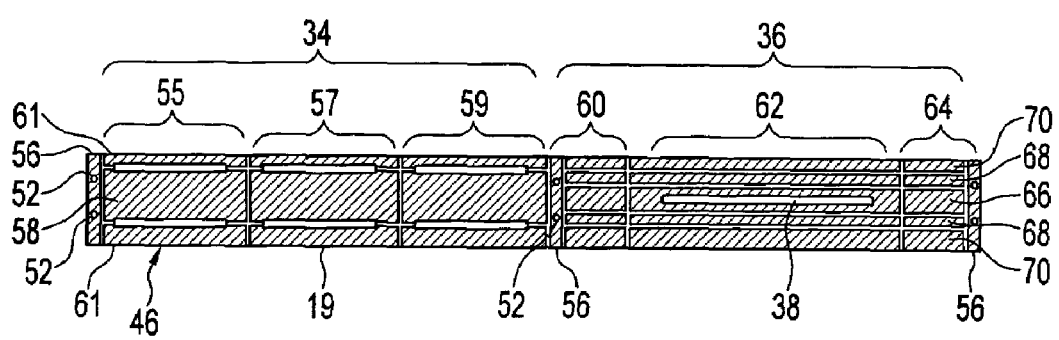
FIG. 4 is a plan view of an inner surface of a printed circuit board of the ion trap mass analyzer of FIG. 2.

Referring now to FIG. 4, the inner trace patterns 46 on one of the PCBs 15, 17, 19 and 21 is shown in more detail. It is understood by those skilled in the art that in other examples different trace patterns can be used. Each of the PCBs 15, 17, 19 and 21 forms part of both the ion guide section 34 and the ion trap and analysis section 36. The inner trace patterns 46 has three strips 56 each having two of the holes 52 for receiving the projections 50 of the metal plates 32, 33 and 35.

In the ion guide section 34, the inner trace patterns 46 include three strip areas 55, 57 and 59 that are electrically isolated from each other. Each of the strip areas 55, 57 and 59 has three corresponding rows of strips including a middle row of strips 58 and a pair of side rows of strips 61 that are also electrically isolated from each other. When a high frequency voltage is applied to the middle row of strips 58 and the pair of side rows of strips 61 are grounded, an approximate quadrupole field is formed, mixed with significant amounts of higher order pole fields, such as a 12-pole field. This field focuses ions traveling through the ion guide section 34 where collision with ambient gas is inevitable. A DC voltage bias can be applied to each strip area 55, 57 and 59 to help the ions travel through the ion guide section 34 and enter into the ion trap and analysis section 36. The DC voltage bias can also be used for accumulation of the ions before injection to the ion trap and analysis section 36, or to accelerate ions in a predetermined direction along the longitudinal axis 63 of the tunnel 29 in order to cause collision induced dissociation. In other embodiments, the inner trace patterns 46 in the ion guide section 34 can include more than three areas 55, 57 and 59 of strips where each strip area would have the same high frequency voltage distribution but a different DC bias.

In the ion trap and analysis section 36, the inner trace patterns 46 include a gate area 60, a trapping area 62 and a stopping area 64 that are electrically isolated from each other. Each of the areas 60, 62 and 64 has five corresponding rows of strips including a middle row of strips 66, a pair of inner rows of strips 68 and a pair of side rows of strips 70 that are also electrically isolated from each other. The strips in each row of strips 66, 68 or 70 are electrically connected to the same high frequency voltage. The middle row of strips 66 is biased with the highest value of high frequency voltage. The pair of side rows of strips 70 are biased with the lowest value of high frequency voltage, or even zero high frequency voltage.

Figure 5:
FIG. 5 is graphical view of a DC potential along a longitudinal axis of the printed circuit board of FIG. 4.

In addition to the high frequency voltages, each of the areas 60, 62 and 64 has a respective DC voltage bias applied, i.e. for each of the areas 60, 62 or 64 the rows of strips 66, 68 and 70 have the same DC voltage bias applied. The DC voltage bias applied to the gate and stopping areas 60 and 64 are normally higher than the DC bias applied to the trapping area 62 thereby creating a DC potential well substantially parallel to the longitudinal axis 63 and within the ion trap and analysis section 36. The DC voltage bias of the gate area 60 can be decreased to let in the ions from the ion guide section 34 (gate opened), and increased to stop the ions entering from the section 34 or from escaping from the section 36 back to the section 34 (gate closed). FIG. 5 shows the DC potential along the longitudinal axis 63 of the tunnel 29 caused by the DC voltage bias applied to the strip areas 55, 57 and 59 in the ion guide section and to the areas 60, 62 and 64. The solid line represents the gate closed configuration, and the dashed line shows the DC potential in the gate area 60 during the gate open configuration.

Figure 6:
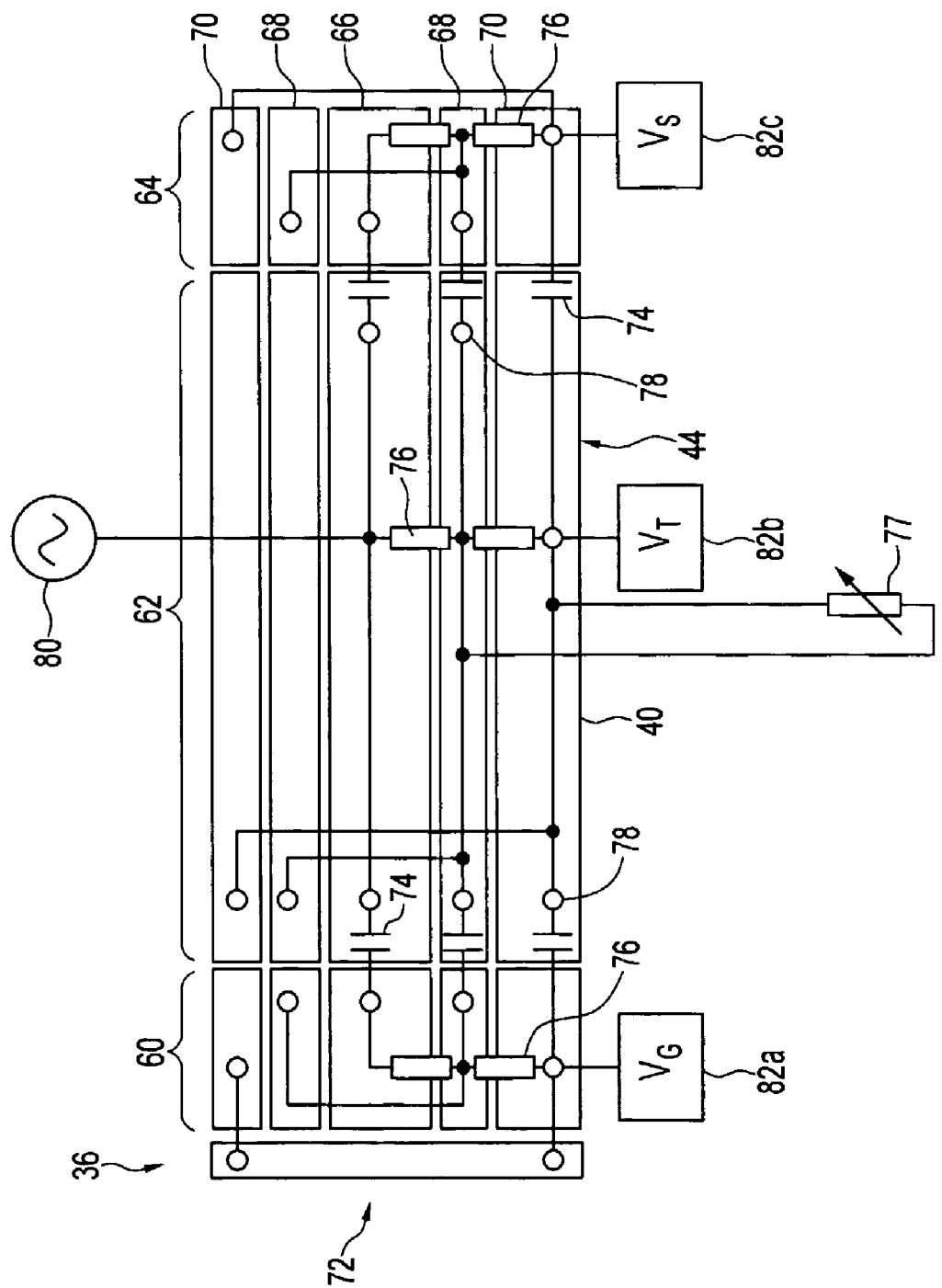
FIG. 6 is a schematic view of a voltage distribution network for an ion trap portion of the ion trap mass analyzer of FIG. 2.

Referring now to FIG. 6, a voltage distribution network is shown on the outer surface 40 of one of the PCBs 15, each of the other PCBs 17, 19 and 21 having a similar arrangement. The voltage distribution network is an RC network, generally indicated by reference numeral 72, which functions to distribute the high frequency voltage and the DC voltage bias to the outer and inner trace patterns 44 and 46 in the ion trap and analysis section 36. The RC network includes capacitors 74 and resistors 76 assembled on the outer surface 40. The circles in FIG. 6 represent vias 78 that electrically couple signals from the outer trace patterns 44 to the inner trace patterns 46. A high frequency AC power supply 80 provides the high frequency voltage and three DC power supplies 82a, 82b and 82c provide voltage levels $V_G$, $V_T$ and $V_S$ representing the gate bias, trapping bias and stopping bias for the gate area 60, the trapping area 62 and the stopping area 64 respectively. The high frequency AC power supply 80, the three DC power supplies 82a, 82b and 82c and the voltage distribution network, e.g. the RC network 72, provide variable electrical potentials to the inner trace patterns 46.

The RC network 72 is connected in such a way that a high frequency voltage gradient is generated substantially along a transverse axis 65, see FIG. 2, which is perpendicular to the longitudinal axis 63 of the tunnel 29, and that the gate, trapping and stopping areas 60, 62 and 64 each have a DC voltage bias. In the ion trap and analysis section 36 of the tunnel 29 there exists a high frequency electric field in a direction substantially perpendicular to the longitudinal axis 63 of the tunnel 29, and which is evenly distributed along the longitudinal axis 63. The high frequency electric field inside the ion trap and analysis section 36 of the tunnel 29 can be made approximately into a 2D quadrupole field by properly selecting the voltage dividing resistors 76. The approximate 2D quadrupole field confines the ions along a radial line from the longitudinal axis 63 of the tunnel 29 (radial confinement). At the same time there also exists a DC electric field substantially parallel to the longitudinal axis 63 which stops the ions from escaping at opposite ends of the ion trap and analysis section 36 (axial confinement).

The aim of forming an ideal quadrupole field in the ion trap and analysis section 36 does not necessarily result in the best analytical performance. The present invention does not provide a pure quadrupole field, and therefore the field is adjusted to deliberately add certain high order multipole fields to compensate for field error. In order to carry out the field adjustments, adjustable resistors 77 are used to adjust the voltage dividing ratios of the resistors 76. The adjustable resistors are located outside the chamber 28, but do not need to be in other embodiments. The adjustable resistors 77 are connected in series or parallel to the resistors 76 by leads extending between the adjustable resistors 77 located outside the vacuum chamber and the resistors 76. The adjustable resistors 77 allow for optimization of the performance of the ion trap and analysis section 36 after it is manufactured and assembled. Therefore the precision required for the manufacture and assembly of the PCBs 15, 17, 19 and 21 can be relaxed in comparison to conventional ion trap mass analyzers. It is understood that it is not always necessary to use the adjustable resistors 77 to compensate for field error.

The ion guide section 34 also has a voltage distribution network (not shown), which is similar to the RC network 72, and may also include adjustable resistors to modify the field by introducing certain high order multipole fields. The components, i.e. resistors 76 and capacitors 74, of the voltage distribution networks are preferably surface mount components, and some of these components may be mounted directly on the outer surface 40 of the PCBs 15, 17, 19 and 21.

The operation of the ion trap mass analyzer 20 shown in FIGS. 2-7 is now described in more detail by discussing the procedure for mass analysis of ions. Ions generated by the ion source, which is external to the ion trap mass analyzer 20, are attracted to the ion guide section 34 of the analyzer 20 through the orifice 37 of the first metal plate 32. By controlling the amplitude and frequency of the high frequency voltage applied to the inner trace patterns 46 in the ion guide section 34, ions within a range of mass to charge ratio are transferred with a stable oscillation trajectory. Due to the high environmental pressure in the ion guide section 34, the kinetic energy of the ions is gradually lost by collision with the ambient gas molecules, and therefore their oscillation amplitudes are gradually reduced. The DC voltage bias applied to the strip areas 55, 57 and 59 creates a DC potential gradient along the longitudinal axis 63 of the tunnel 29 through the ion guide section 34, which maintains the longitudinal velocity of the ions so that they move along the axis towards the ion trap and analysis section 36.

In an ion introduction period, the DC voltage bias of the inner trace patterns 46 in the gate area 60 of the ion trap and analysis section 36 is dropped so that the potential level is similar to the ion guide section 34 (see FIG. 4 and dashed line of FIG. 5). Ions then pass through the orifice 37 of the second metal plate 33, which is at the same potential as the gate area 60, through the gate area 60 of the ion trap and analysis section 36 and continue to travel forward until they are retarded by the potential created by the DC voltage bias applied to the inner trace patterns 46 in the stopping area 64 of the ion trap and analysis section 36. The high frequency voltage applied to the inner trace patterns 46 in the ion trap and analysis section 36 is set to maintain stability of the ions within a range of mass to charge ratio.

After the introduction period, the DC voltage bias applied to the inner trace patterns 46 in the gate area 60 of the ion trap and analysis section 36 is raised so that a potential well is created therein between the gate area 60 and the stopping area 64, along the longitudinal axis 63 of the tunnel 29. This prevents further ions from entering into and leaving the ion trap and analysis section 36. While the ions are in the ion trap and analysis section 36, they travel forwards and backwards within the potential well between the gate area 60 and the stopping area 64 and are restrained in a radial direction by the quadrupole field created by the high frequency voltage applied to the RC network 72. The ions gradually lose their energy from collisions. The cooled down ions gather around the central, longitudinal axis 63 of the tunnel 29 in the ion trap and analysis section 36 and distribute axially along a distance slightly shorter than the inner trace patterns 46 in the trapping section 62.

Next, the high frequency voltage, also called the trapping voltage, is scanned by controlling the high frequency AC power supply 80. The scan can be an amplitude scan where the amplitude of the power supply 80 is varied over time while the frequency is kept constant, or the scan can be a frequency scan where the frequency is varied over time while the amplitude is kept constant. In either situation ions which were originally in a stable state become unstable and eject from the ion trap and analysis section 36. Some of the ejected ions pass through the slit 38 in one of the PCBs 15, 17, 19 and 21 and are detected by the detector 31 mounted at the side of the ion trap and analysis section 36. In order to make sure the ions are ejected in the direction towards the slit 38 and the detector 31, the applied quadrupole field may contain a small DC component which results in instability first being reached in the direction of the slit 38 causing the ions to increase their amplitude of oscillation in the direction of the slit 38. The small DC component may be added in a variety of ways. The principle of controlling ion instability has been well taught in books such as "Aspects of Quadrupole Ion Trap Mass Spectrometry." Referring to FIG. 7, one of the variety of ways to add the small DC component is by using two controllable DC supplies 90, each connected in series to one phase of the high frequency AC power supplies 80.

Figure 7:
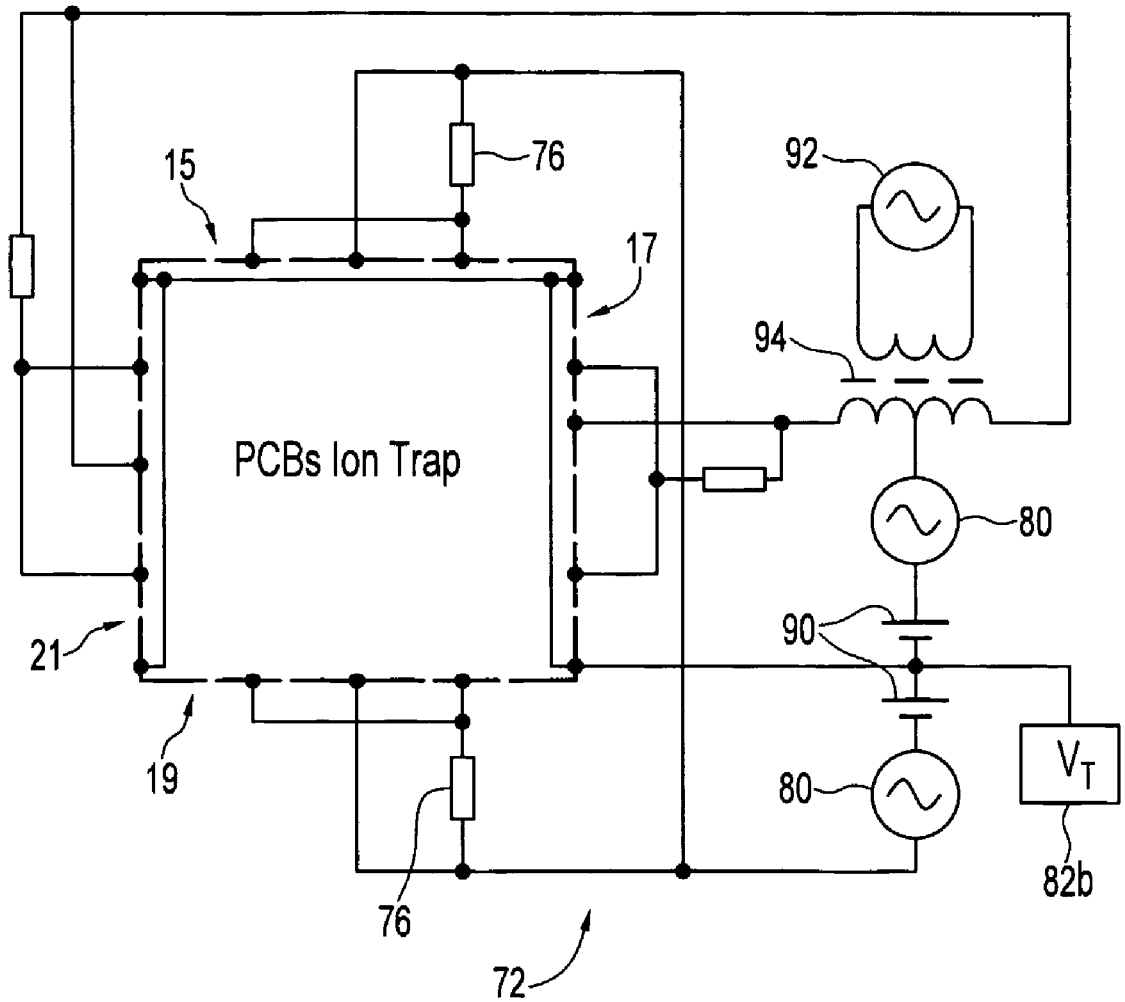
FIG. 7 is a schematic view of a resonance excitation and ejection circuit for the ion trap mass analyzer of FIG. 2.

Another method employed to eject ions is resonance ejection. The general circuit topology to achieve resonance ejection mode in the ion trap and analysis section 36 is illustrated in FIG. 7. Not all of the components of the voltage distribution network, i.e. the RC network 72, are shown in FIG. 7 for clarity, as would be understood by those skilled in the art. An AC voltage power supply 92 is used to provide a supplementary quadrupole field drive. The excitation voltage of the AC power supply 92 is coupled differentially to right and left hand side PCBs 17 and 21 respectively by coupling the excitation voltage through a transformer 94. With such an arrangement, both a trapping quadrupole field and a dipole excitation field can be generated in the ion trap and analysis section 36. The motions of the ions in the ion trap and analysis section 36 can be excited when the resonance condition is matched. The theory of resonance excitation has been well developed and so will not be described in further detail. When the high frequency power supplies 80 and 92 are scanned ions can be ejected through the slit 38 and can be detected in order of mass to charge ratio, and therefore a mass spectrum is obtained.

The resonance effect may be further used for parent ion selection and dissociation so that a tandem MS can be obtained in the ion trap and analysis section 36. The mechanism for parent ion isolation (by ejecting all unwanted ions) and mass selective activation for CID can be the same as that for a conventional ion trap mass spectrometer.

The waveform of the high frequency power supply 80 does not necessarily need to be a sinusoidal waveform, which is what is normally generated from an RF resonator. The ion trap mass analyzer 20 can adapt to a switching power supply, i.e. a square wave waveform. In such a case, the dielectrical performance of the material of the PCBs 15, 17, 19 and 21 has little effect on the RC network 72, i.e. the voltage distribution network, since there is not a highly tuned LC resonator during the operation. Without the tuning problem of the RC network 72, the selection of parameters and components for the voltage distribution network in the ion trap and analysis section 36 is simplified.

Figure 8:
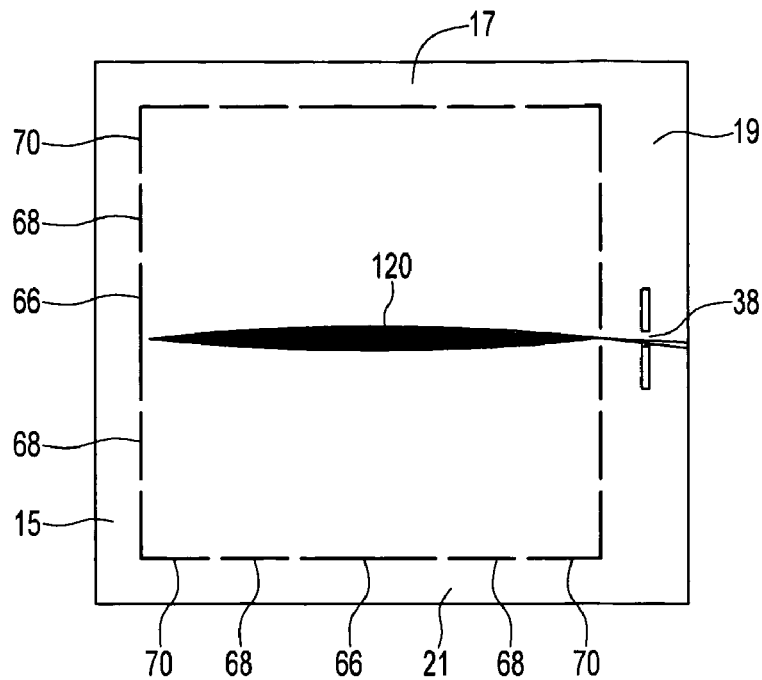
FIG. 8 is a simulated view of trapped ions being ejected from an ion trap of the ion trap mass analyzer of FIG. 2 upon resonance with a timed excitation voltage.

Referring now to FIG. 8, there is shown a simulation of resonance ejection. In this simulation, the ion trap and analysis section 36 (see FIG. 2) has a trapping volume of 10×10 mm$^2$ cross section formed by the PCBs 15, 17, 19 and 21. Each of the PCBs 15, 17, 19 and 21 has the five rows of strips including the middle row of strips 66, the pair of inner rows of strips 68 and the pair of side rows of strips 70. The side rows of strips 70 of adjacent PCBs are electrically connected together and grounded. The trapping volume of the ion trap and analysis section 36 is surrounded with twenty electrodes, which effectively is sixteen electrodes since adjacent side row strips 70 are electrically connected, and the electrodes in part form the quadrupole trapping field and also the dipole excitation field. The middle row of strips 66 on each of the PCBs 15, 17, 19 and 21 is charged to a square wave with amplitude of 500V. The eight inner rows of strips 68 are charged to 72-80% of the value of the voltage on the middle rows of strips 66. The variable ratio is indicative of the adjustment associated with the adjustable resistors 77 in the RC network 72. When the high frequency power supply 80 has a frequency of 460 kHz, for the quardupole field, and when the supplementary power supply 92 (see FIG. 7) has a frequency of 115 kHz, for the dipole excitation field, resonant ions 120 expand their oscillation amplitude and eject through the slit 38. Although the geometry of the twenty electrodes does not form a perfect quadrupole field, simulation results indicate that a mass resolution of over 2500 can be reached using a resonance ejection scan at a speed of 800 AMU/second.

The substrate material of the PCBs 15, 17, 19 and 21 is preferably a type which is firm and non-porous to prevent possible dimension variations and absorption-desorption of gas or vapour during the use of the device. Standard FR-4 glass fiber-epoxy board can be used as the substrate material of the PCBs 15, 17, 19 and 21 for the ion trap mass analyzer 20, and in this situation the analyzer 20 would have a short to medium lifetime and a medium precision compared to ion trap mass analyzers constructed with more exotic PCB materials. In other embodiments, the substrate material of the PCBs 15, 17, 19 and 21 can be PTFE or ceramic, for example, but other materials are possible.

In order to avoid surface charge buildup on the bare part of the PCB substrate, the gap between the metal traces is preferably coated with a highly resistive material. The resistivity of the material is preferably high enough so that there is negligible influence to the designed signal distribution, but the material is still capable of releasing the deposited surface charge. It may also be possible to modify the substrate material, i.e. at least on the inner surface 42 (see FIG. 3) with certain doping materials to reduce the resistivity.

Figure 10:
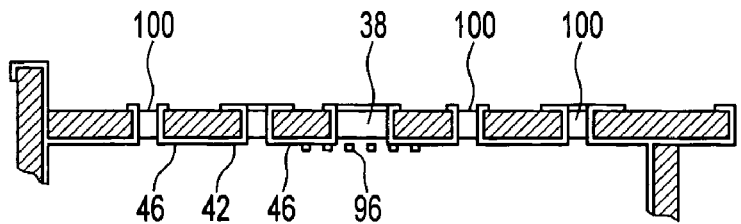
FIG. 10 a sectional view of printed circuit boards showing a coated slot and a mesh to avoid surface charge problems according to another embodiment of the present invention.

Referring to FIG. 10, for areas in the ion trap mass analyzer 20 requiring a high precision electric field, for example in the ion trap and analysis section 36 shown FIG. 2, it is preferred to use a plated slot 100 instead of etching gaps between strips of the inner trace patterns 46 at inner surface 42. The metal layer at the inner surface 42 of the PCBs 15, 17, 19 and 21 is preferably gold plated copper with a thickness >0.1 mm. The ejection slit 38 is preferably plated with a conductor. A metal mesh 96 can be used to cover substantially wide slits 38 in order to reduce field distortion.

The trace pattern described above (see FIG. 4) is only one of the possible trace pattern embodiments that can be used for construction of the ion trap mass analyzer 20 of the present invention. There are, in fact, many different ways that the inner trace patterns 46 of the PCBs 15, 17, 19 and 21 can be designed to form the required electric field for ion transmission in the ion guide section 34 and ion analysis in the ion trap and analysis section 36.

Figure 9:
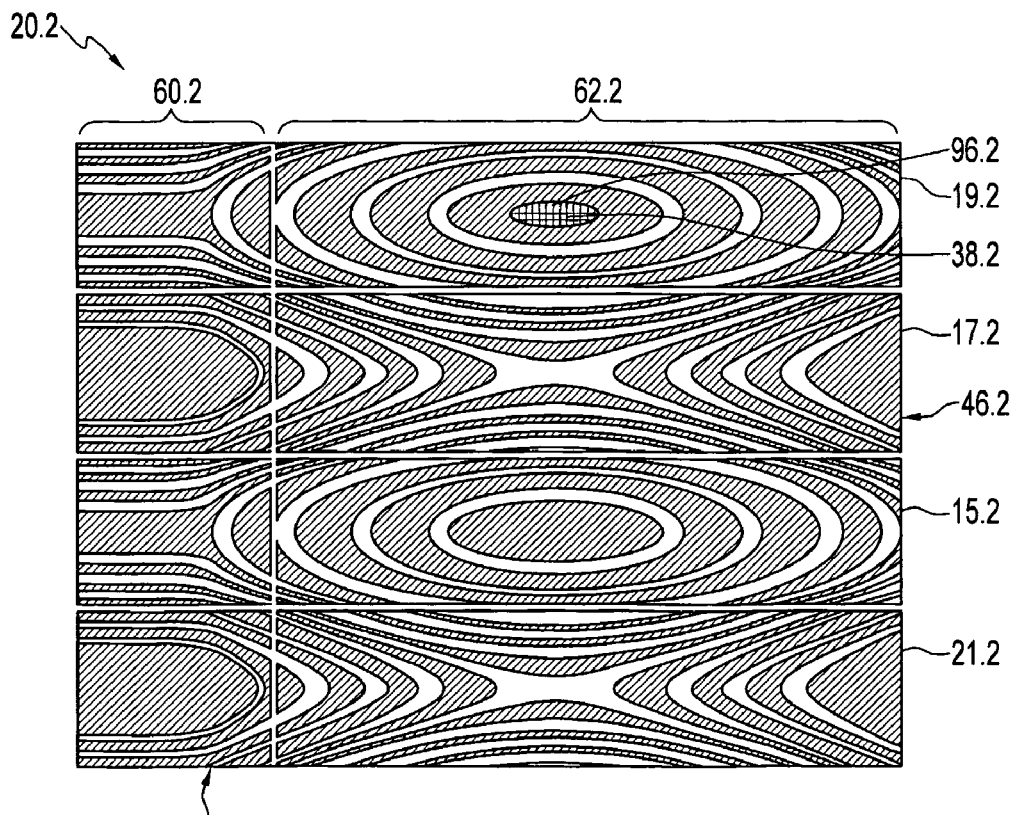
FIG. 9 is a plan view of trace patterns on printed circuit boards according to another embodiment of the present invention.

Referring now to FIG. 9, another embodiment of inner trace patterns 46.2 of the ion trap and analysis section 36.2 is shown, wherein like parts to the previous embodiment have like reference numerals with an additional suffix ".2". The ion trap and analysis section 36.2 has four PCBs 15.2, 17.2, 19.2 and 21.2 in this example. The four PCBs 15.2, 17.2, 19.2 and 21.2, shown here in an exploded planar view, form a square tunnel. The inner trace patterns 46.2 on opposite pairs 15.2 and 19.2 are elliptical in shape, and the inner trace patterns 46.2 on opposite pairs 17.2 and 21.2 are hyperbolic in shape. A gate area 60.2, which is supplied with a controllable DC voltage bias, performs both an ion introduction function and blocking function as described in the previous embodiment. A trapping area 62.2 is where the ions are trapped and then analyzed. At least one of the PCBs 15.2, 17.2, 19.2 and 21.2 (in the present embodiment it is PCB 19.2) has an elongated hole or slit 38.2 for ejection of ions. If the slit 38.2 is substantially large it can be covered by a fine metal mesh 96.2 to minimize field distortions. Conventional elliptical ion traps are very difficult to form by mechanical machining, but they have unique performance characteristics compared with other conventional 3D ion traps. By using conventional PCB manufacturing techniques, the complicated elliptical and hyperbolic patterns can easily be etched onto the PCBs 15.2, 17.2, 19.2 and 21.2 and therefore the complicated field structure of the ion trap and analysis section 36.2 can be generated at a greatly reduced manufacturing cost.

The above descriptions of the ion trap mass analyzers 20 and 20.2 have been based on a PCB assembly with a single tunnel 29. However, several tunnels may be combined together in a multiple stage tandem mass analyzer MS" to achieve higher throughput and higher sensitivity. Normally, a conventional single ion trap can run MS" within its trapping volume, using sequentially timed stages. In each stage all ions except for the selected parent ion are excluded from the trap. If another parent ion needs to be profiled then sample ions need to be reintroduced into the ion trap. This results in a long analyzing period and low sample efficiency.

Figure 11:
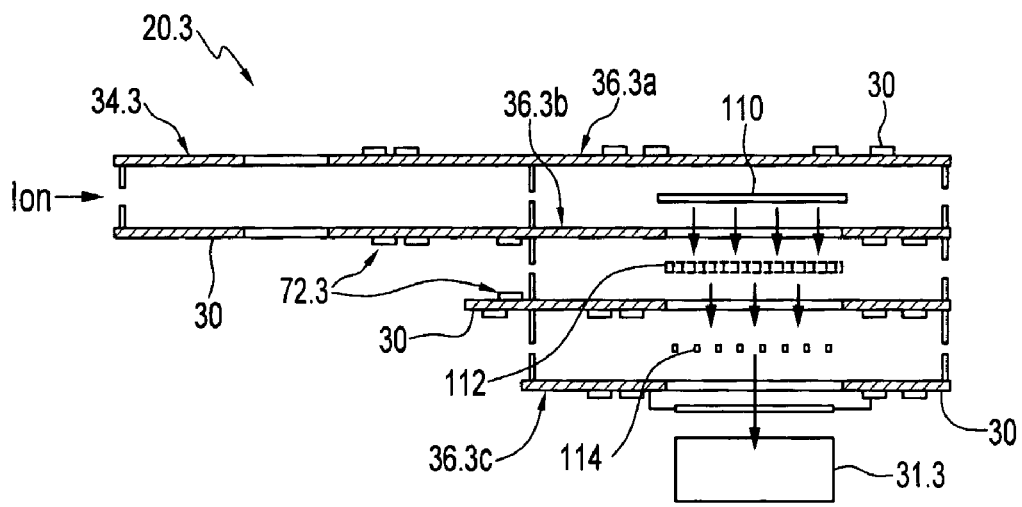
FIG. 11 is a sectional view of an ion trap mass analyzer having multiple ion traps according to another embodiment of the present invention.

Referring now to FIG. 11, another embodiment of an ion trap mass analyzer 20.3 is shown, wherein like parts to previous embodiments have like reference numerals with an additional suffix ".3". The ion trap mass analyzer 20.3 has an ion guide section 34.3 and parallel ion trap and analysis sections 36.3a, 36.3b, and 36.3c, each made from PCBs 30. For parent ion selection, instead of ejecting all unwanted ions, the selected parent ion within the ion cloud 110 is ejected to the ion trap and analysis section 36.3b by resonance ejection. The resonance ejection method in the present embodiment is similar to the method discussed above for mass scan, but in this example the ion trap and analysis section 36.3b replaces the detector 31. In the ion trap and analysis section 36.3b it is normal to apply the same value of high frequency voltage as used in the ion trap and analysis section 36.3*a*. The dipole excitation voltage for the ion trap and analysis section 36.3*b* can be set to have a combination of phase and intensity to either further excite and eject the ions to the following tunnel, or to keep them trapped with a large oscillation amplitude so that they collide with the ambient gas for fragmentation, or to decelerate the ions' motion. In the case of fragmentation, a daughter ion cloud 112 is generated and trapped in the ion trap and analysis section 36.3*b*.

In the next step, one of the daughter ions from the daughter ion cloud 112 can be further selected and ejected into the ion trap and analysis section 36.3*c*, where the daughter ions dissociate and result in granddaughter ions 114. Finally, $MS^3$ can be obtained by ejecting the granddaughter ions 114 to detector 31.3 in a scanned ejection process in the ion trap and analysis section 36.3*c*.

Both sides of the PCBs 30 between any two of the ion trap and analysis sections 36.3*a-c* are used for forming the trapping field. Therefore, the voltage distribution network 72.3 may be mounted on extended edges of the PCBs 30.

The difference of this $MS^n$ method compared with the conventional method is that in every selection step unselected ion species are still preserved in the source ion trap and analysis section 36.3*a*, 36.3*b* or 36.3*c*. One of the preserved ions can be selected again and ejected downstream to the ion trap and analysis sections 36.3*a*, 36.3*b* or 36.3*c* for fragmentation. Therefore all the fragmentation channels can be analyzed without refilling the first ion trap and analysis section 36.3*a*. Due to the novel PCB configuration, the large trapping capacity of the multiple stage ion trap and analysis sections 36.3*a*, 36.3*b* or 36.3*c* provides good signal intensity and therefore high efficiency. Furthermore, due to low manufacturing and assembly costs of the PCBs 30, this multiple stage ion trap mass analyzer 20.3 is low cost and affordable to use.

The ejection precursor to the second ion trap and analysis section 36.3*b* can be operated in a slow scan fashion. Each ion scanned into the second ion trap and analysis section 36.3*b*, where a higher pressure of collision gas is applied, will experience dissociation quickly and the resultant daughter ions 112 will be formed quickly. For each scan step of the first ion trap and analysis section 36.3*a*, a full daughter ion scan 112 can be followed. When the slow scan of the first ion trap and analysis section 36.3*a* is completed, a two dimensional mass spectrum can be obtained.

Figure 12:
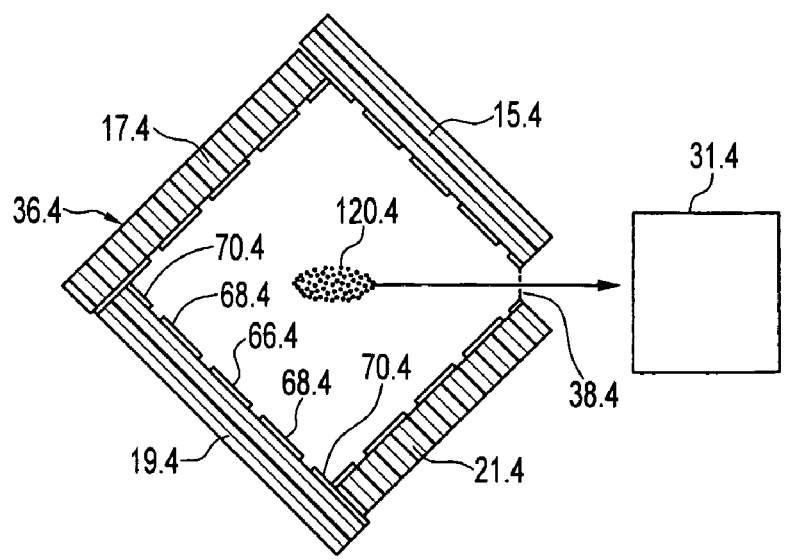
FIG. 12 is a cross-sectional view of an ion trap mass analyzer according to another embodiment of the present invention.

Referring now to FIG. 12, another embodiment of an ion trap mass analyzer of the present invention is shown, wherein like parts have like reference numerals with an additional suffix "0.4". In this embodiment, an ion trap and analysis section 36.4 has a slit 38.4 formed between edges of adjacent PCBs 15.4 and 21.4. Ions 120.4 in the ion trap and analysis section 36.4 can be ejected through the opening 38.4 by the methods discussed above in previous embodiments and detected by detector 31.4. In this example, side rows of strips 70.4 are charged with the highest value high frequency voltage, which is then distributed, substantially linearly, along each side over rows of strips 68.4 and 66.4 respectively. When a dipole excitation is applied between left and right corners, the ions 120.4 are ejected through the opening 38.4 to the detector 31.4. The opening 38.4 may have a metal plate with a slit or a mesh attached thereto to minimize any field distortions.

As will be apparent to those skilled in the art, various modifications to the above described embodiments may be made within the scope of the appended claims. For example, the cross-section of tunnel 29 does not necessarily need to be rectangular in shape and can be other shapes and may include more than four PCBs.

All conventional techniques used in the fabrication of PCBs may be adopted to improve the performance of the ion trap mass analyzer of the present invention. For example, a buried ground layer, commonly used for high frequency PCB layout design, can be employed to screen out high frequency interruptions and to act has a heat sink to dissipate and distribute the heat generated by the localized voltage distribution network on the outer surface of the PCBs, thereby more evenly distributing the temperature gradient of the PCBs. Additionally, blind vias can be used to avoid external fields penetrating into the tunnel.

As another example, due to the low manufacturing cost for this device it may also be used as a consumable and modular part of a complicated instrument, such as a source for a ToF system. A modular, consumable part is especially desirable when hazardous materials are being analyzed.

What is claimed is:

1. An ion trap mass analyzer comprising:
    an elongated tunnel having a wall, a longitudinal axis and an inner space, the wall comprising a substrate and conductor trace patterns; and
    variable electric potential means for providing electric potentials, the variable electric potential means being connected to the conductor trace patterns, the conductor trace patterns and the variable electric potential means providing a variable electric field within the inner space of the tunnel for transferring, storing, and analyzing ions.

2. The ion trap mass analyzer as claimed in claim 1, wherein the wall comprises a printed circuit board.

3. The ion trap mass analyzer as claimed in claim 2, wherein the printed circuit board comprises a substrate having glass fiber material.

4. The ion trap mass analyzer as claimed in claim 1, wherein the variable electric potential means comprises a variable electric potential source and a voltage distribution network.

5. The ion trap mass analyzer as claimed in claim 4, wherein the voltage distribution network comprises an RC network.

6. The ion trap mass analyzer as claimed in claim 5, wherein the voltage distribution network further includes an adjustable resistor, the adjustable resistor operable to adjust an impedance of the RC network.

7. The ion trap mass analyzer as claimed in claim 1, wherein the variable electric potential means comprises a DC potential source, an AC potential source and a voltage distribution network.

8. The ion trap mass analyzer as claimed in claim 1, wherein the ion trap mass analyzer includes an ion transmission section and an ion trapping and analysis section, ions being injected into the ion trapping and analysis section from the ion transmission section.

9. The ion trap mass analyzer as claimed in claim 1, wherein the wall comprises a plurality of printed circuit boards, each of said printed circuit boards extending alongside the longitudinal axis and being adjacent to respective printed circuit boards, the plurality of printed circuit boards forming the tunnel.

10. The ion trap mass analyzer as claimed in claim 9, wherein the ion trap mass analyzer further includes a plate having an orifice, the plate being substantially perpendicular to the longitudinal axis and connecting said printed circuit boards together.

11. The ion tap mass analyzer as claimed in claim 10, wherein there are four said printed circuit boards.

12. The ion trap mass analyzer as claimed in claim 1, wherein the conductor trace patterns and the variable electric potential means providing the variable electric field that is dominated by a quadrupole electric field in a direction perpendicular to the longitudinal axis.

13. The ion trap mass analyzer as claimed in claim 1, wherein the conductor trace patterns comprise a plurality of parallel conductor strips, said parallel conductor strips being substantially parallel to the longitudinal axis.

14. The ion trap mass analyzer as claimed in claim 13, wherein the conductor trace patterns comprise a plurality of conductor trace pattern areas along the longitudinal axis, each of said conductor trace pattern areas being adjacent and electrically isolated from respective conductor trace pattern areas and comprising the parallel conductor strips.

15. The ion trap mass analyzer as claimed in claim 14, wherein the variable electric potential means provides DC electric potentials, the parallel conductor strips in each said conductor trace pattern area having one of the DC electric potentials.

16. The ion trap mass analyzer as claimed in claim 13, wherein the variable electric potential means provides AC electric potentials, each of said parallel conductor strips having one of the AC electric potentials applied thereto.

17. The ion trap mass analyzer as claimed in claim 1, wherein the wall comprises four printed circuit boards including a first pair of opposed printed circuit boards and a second pair of opposed printed circuit boards, each of said printed circuit boards extending along the longitudinal axis and being adjacent to respective said printed circuit boards, the printed circuit boards forming the tunnel, the first pair of opposed printed circuit boards having concentric elliptical conductor trace patterns and the second pair of opposed printed circuit boards having hyperbolic conductor trace patterns.

18. The ion trap mass analyzer as claimed in claim 1, wherein the wall further comprises an opening through which ions can be ejected from the ion trap mass analyzer.

19. The ion trap mass analyzer as claimed in claim 18, wherein the ion trap mass analyzer further includes an ion detector adjacent the ion trap mass analyzer and adjacent the opening.

20. The ion trap mass analyzer as claimed in claim 18, wherein the ion trap mass analyzer further includes a metal mesh covering the opening.

21. The ion trap mass analyzer as claimed in claim 1, wherein the variable electric potential means comprises a dipole AC electric field means, said dipole AC electric field means providing a dipole AC electric field perpendicular to the longitudinal axis of the tunnel.

22. The ion trap mass analyzer as claimed in claim 1, wherein the substrate comprises an insulator.

23. The ion trap mass analyzer as claimed in claim 1, wherein the substrate comprises a semiconductor.

24. An ion trap mass analyzer comprising:
a plurality of ion trapping and analysis sections, each of the ion trapping and analysis sections comprising an elongated tunnel having a wall, a longitudinal axis and an inner space, the wall comprising a substrate and conductor trace patterns, each of the ion trapping and analysis sections being adjacent to and extending alongside respective ones of the ion trapping and analysis sections; and
a variable electric potential means for providing electric potentials being connected to the conductor trace patterns of each of the ion trapping and analysis sections.

25. A method for tandem mass analysis using an ion trap mass analyzer having a plurality of ion trap and analysis sections, each of the ion trap and analysis sections comprising an elongated tunnel having a wall, a longitudinal axis and an inner space, the wall comprising a substrate and conductor trace patterns, each of the ion trap and analysis sections extending alongside respective adjacent ion trap and analysis sections, the method comprising the steps of:
applying a high frequency voltage to the conductor trace patterns to create a trapping quadrupole electric field in each of the ion trap and analysis sections;
providing ions in a first one of the ion trap and analysis sections;
cooling the ions in the first one of the ion trap and analysis sections using a buffer gas;
applying an excitation voltage to the conductor trace patterns in the first one of the ion trap and analysis sections to eject selected precursor ions by means of resonance ejection to a second one of the ion trap and analysis sections, the second one of the ion trap and analysis sections being adjacent the first one of the ion trap and analysis sections;
fragmenting the precursor ions in the second one of the ion trap and analysis sections; and
gathering and ejecting the fragmented ions from the second one of the ion trap and analysis sections.

26. A method for tandem mass analysis as claimed in claim 25, wherein the step of ejecting the fragmented ions further includes the steps of:
applying an additional AC voltage to the conductor trace patterns in the second one of the ion trap and analysis sections to create a dipole AC field;
scanning the additional AC voltage in the second one of the ion trap and analysis sections to eject the fragmented ions; and
detecting the ejected fragmented ions in order of their mass to charge ratio.

27. A method for tandem mass analysis as claimed in claim 25, wherein the step of ejecting the fragmented ions further includes the steps of:
applying an additional AC voltage to the conductor trace patterns in the second one of the ion trap and analysis sections to create a dipole AC field;
scanning the high frequency voltage in the second one of the ion trap and analysis sections to eject the fragmented ions; and
detecting the ejected fragmented ions in order of their mass to charge ratio.

28. A method for manufacturing an ion trap mass analyzer comprising the steps of:
preparing multi-layer printed circuit boards having trace patterns;
forming a polygonal tunnel using said printed circuit boards; and
bonding the printed circuit boards with metal plates inside the polygonal tunnel;
wherein the trace patterns on a tunnel side of the printed circuit boards are designed to create the required electric field within the polygonal tunnel for transferring, storing and analyzing ions when appropriate voltages are applied to the traces.

29. The method for manufacturing as claimed in claim 28, wherein the method further includes the steps of:
mounting voltage distribution components on the printed circuit boards;
connecting the voltage distribution components to the conductor trace patterns; and
connecting power supply leads to the trace patterns.

30. The method for manufacturing as claimed in claim 29, wherein the method further includes the step of selecting parameters of the voltage distribution components so that an electric potential is distributed to the trace patterns with a ratio such that a quadrupole electric field is established.

31. The method for manufacturing as claimed in claim 30, wherein the method further includes the step of providing an external adjustable device, said external adjustable device allows selectively superimposing a small amount of high order multipole electric field to the quadrupole field.

32. The method for manufacturing as claimed in claim 29, wherein the voltage distribution components comprise resistors and capacitors.

33. The method for manufacturing as claimed in claim 29, wherein the voltage distribution components are surface mount components.

34. The method for manufacturing as claimed in claim 28, wherein the method further includes the steps of:

making slots through the printed circuit boards, said slots extending from a first surface of the printed circuit board through to a second surface of the printed circuit board;

coating the slots with conductive material; and connecting the conductor trace patterns on the first surface of the printed circuit boards to the trace patterns on the second surface of the printed circuit board using part of the conductive material.

35. The method for manufacturing as claimed in claim 28, wherein the method further includes the step of depositing semi-conductive material to a surface of the printed circuit boards.

36. The method for manufacturing as claimed in claim 35, wherein said surface is on the tunnel side of the printed circuit board.

\* \* \* \* \*